United States Patent
Lee et al.

(10) Patent No.: US 7,443,255 B2
(45) Date of Patent: Oct. 28, 2008

(54) OSCILLATOR CIRCUIT AND METHOD FOR ADJUSTING OSCILLATION FREQUENCY OF SAME

(75) Inventors: Kang-Jin Lee, Seoul (KR); Ji-Hyun Kim, Gwacheon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 63 days.

(21) Appl. No.: 11/472,409

(22) Filed: Jun. 22, 2006

(65) Prior Publication Data
US 2007/0008042 A1    Jan. 11, 2007

(30) Foreign Application Priority Data
Jul. 6, 2005    (KR)    ............ 10-2005-0060836

(51) Int. Cl.
*H03K 3/26*    (2006.01)
(52) U.S. Cl. .................. 331/111; 331/143; 331/176
(58) Field of Classification Search ............ 331/65, 331/66, 108 R, 111, 116 R, 158, 143, 175, 331/176, 177 R, 177 V
See application file for complete search history.

(56) References Cited

U.S. PATENT DOCUMENTS

| | | | | |
|---|---|---|---|---|
| 5,117,206 A | * | 5/1992 | Imamura | ............... 331/158 |
| 5,548,252 A | * | 8/1996 | Watanabe et al. | ............ 331/176 |
| 5,870,000 A | | 2/1999 | Matsuda et al. | |
| 6,476,682 B1 | * | 11/2002 | Cole et al. | ............... 331/176 |
| 6,661,302 B1 | * | 12/2003 | Rathore et al. | ............... 331/158 |
| 7,068,116 B2 | * | 6/2006 | Kato et al. | ............... 331/111 |
| 7,123,105 B2 | * | 10/2006 | Kim et al. | ............... 331/66 |

FOREIGN PATENT DOCUMENTS

| | | |
|---|---|---|
| JP | 2000-286636 | 10/2000 |
| JP | 2005-006030 | 1/2005 |
| KR | 10-311819 | 9/2001 |
| KR | 1020040057237 | 7/2004 |

* cited by examiner

*Primary Examiner*—Robert J. Pascal
*Assistant Examiner*—Ryan J. Johnson
(74) *Attorney, Agent, or Firm*—Volentine & Whitt, PLLC (57) ABSTRACT

An oscillator comprises a data storage unit, an oscillation unit, and a control unit. The data storage unit is adapted to store a plurality of reference condition codes and a plurality of reference control codes. The oscillation unit is adapted to output an oscillation signal having an oscillation frequency that varies according to a control code. The control unit is adapted to generate the control code with a target value based on the reference condition codes and the reference control codes and a current condition code input to the control unit. Where control code has the target value, the oscillation unit outputs the oscillation signal with the oscillation frequency substantially equal to a target oscillation frequency.

13 Claims, 9 Drawing Sheets

OSCILLATOR CIRCUIT AND METHOD FOR ADJUSTING OSCILLATION FREQUENCY OF SAME

BACKGROUND OF THE INVENTION

1. Field of the Invention

Embodiments of the present invention relate generally to oscillators and methods of adjusting the oscillation frequency of the oscillators. More particularly, embodiments of the invention relate to oscillators and methods of adjusting the oscillation frequency of the oscillators to compensate for changing external environmental factors such as temperature, and power supply voltage levels.

A claim of priority is made to Korean Patent Application No. 2005-60836 filed on Jul. 6, 2005, the disclosure of which is hereby incorporated by reference in its entirety.

2. Description of Related Art

An oscillator is a device used to generate a continuous output waveform. For example, an oscillator typically comprises a tuned electronic circuit adapted to generate an alternating current such as a periodic signal. Most oscillators can be roughly classified into one of two groups: external oscillators such as crystal oscillators, and internal oscillators included in semiconductor devices.

Historically, oscillators have been used in a variety of electronic devices such as computer systems, semiconductor devices, and communication devices. More recently, oscillators have been adopted in a number of in portable electronic devices such as cellular phones, personal digital assistants (PDAs), smart batteries of cellular phones, and so on. In order to meet the performance requirements of such portable devices, much research has been devoted to designing oscillators having lower power consumption, lower cost, and improved output accuracy and stability.

Figure 1:
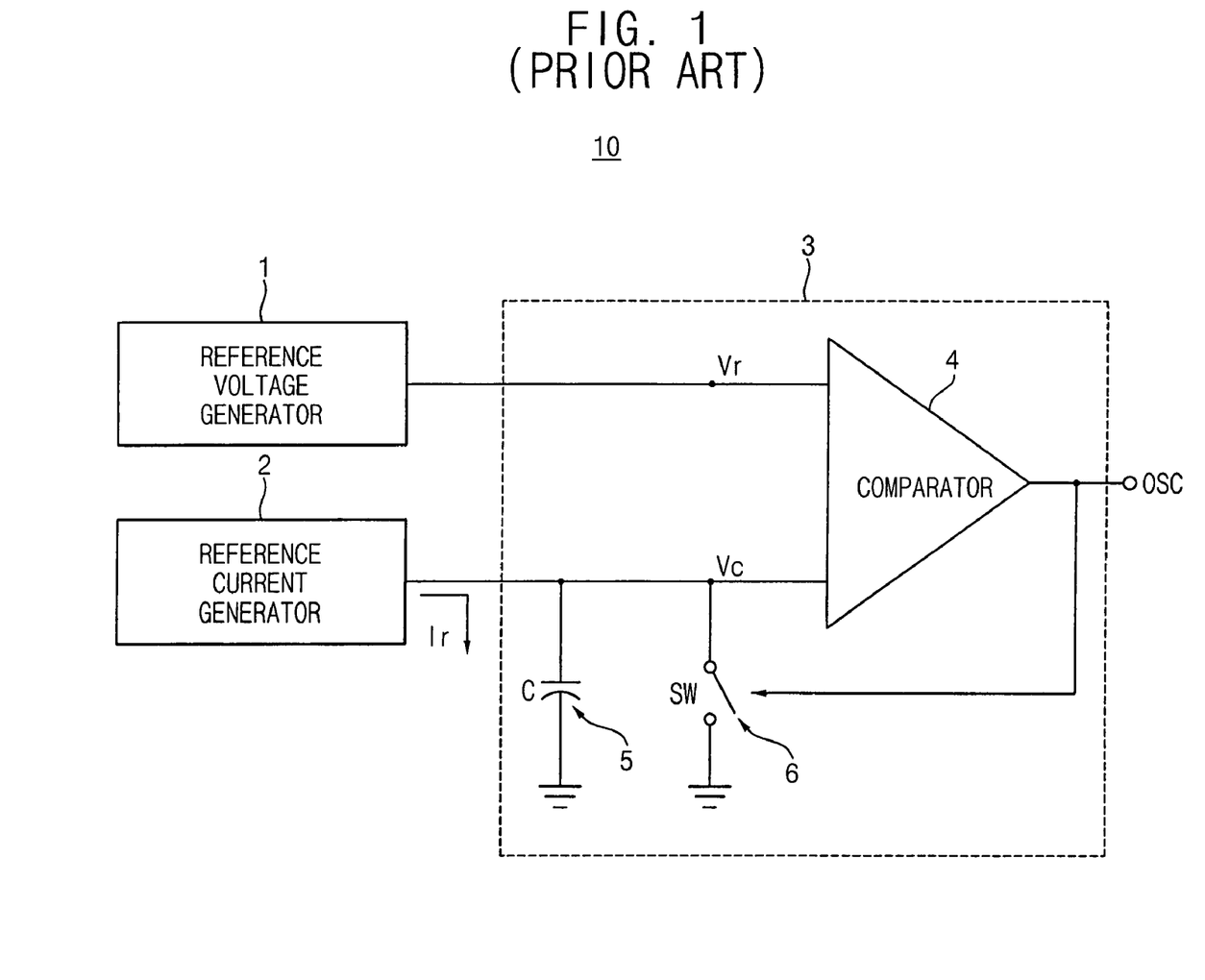
FIG. 1 is a circuit diagram illustrating a conventional oscillator.

FIG. 1 is a circuit diagram illustrating a typical configuration of a conventional oscillator.

Referring to FIG. 1, an oscillator 10 includes a reference voltage generator 1, a reference current generator 2 and an oscillation unit 3. Oscillation unit 3 includes a comparator 4, a capacitor 5 and a switch 6.

Reference voltage generator 1 generates a reference voltage "Vr", reference current generator 2 generates a reference current "Ir", and oscillation unit 3 generates an oscillation signal "Osc" with a logic state based on a comparison between reference voltage "Vr" and a comparison voltage "Vc" produced by reference current "Ir".

Comparator 4 has a reference input terminal coupled to an output terminal of reference voltage generator 1 and a comparison input terminal coupled to an output terminal of reference current generator 2. Capacitor 5 and switch 6 are coupled in parallel to the comparison input terminal of comparator 4.

When capacitor 5 is charged by reference current Ir, comparison voltage "Vc," which is apparent at the comparison input terminal of comparator 4, increases. When comparison voltage Vc is higher than reference voltage Vr, switch 6 is turned on in response to a change in the logic state of oscillation signal Osc, and comparison voltage Vc rapidly decreases to a ground voltage by discharging through switch 6.

Switch 6 is turned off in response to a change in the logic state of oscillation signal Osc after comparison voltage Vc is discharged through switch 6. The above sequence of voltage changes is repeated so that oscillation signal Osc continues to oscillate between a first logic state and a second logic state.

The oscillator typically provides a timing signal function (e.g, a clock) for an electrical system. Accordingly, if the output frequency of the oscillator does not correspond to a target frequency of the system, the system may not function correctly.

The output frequency of the oscillator can vary based on a number of factors such as the process conditions used when manufacturing the oscillator, and external environmental factors such as power voltage and temperature, to name but a few. For example, the output frequency of an oscillator may not be stable over a wide temperature range of about −30° C. through 140° C.

To avoid problems arising from instability, conventional oscillators often provide various compensation circuits. For example, a reference voltage generator sensitive to power voltage and temperature may be replaced by a high-cost product that is insensitive to temperature differences. Also, compensator circuits may be configured to compensate for temperature differences by generating a current that is in inversely proportional to a temperature of the reference current generator.

Unfortunately, these compensation circuits are generally complex, and they tend to increase the power consumption, test times, and cost of the oscillator.

SUMMARY OF THE INVENTION

Accordingly, various embodiments of the present invention are provided to address the need for power, cost, and time efficient oscillators capable of stable operation even under changing environmental conditions.

According to one embodiment of the invention, an oscillator is provided. The oscillator comprises a data storage unit, an oscillation unit, and a control unit. The data storage unit is adapted to store a plurality of reference condition codes and a plurality of reference control codes. The oscillation unit is adapted to output an oscillation signal having an oscillation frequency that varies according to a control code. The control unit is adapted to generate the control code with a target value based on the reference condition codes and the reference control codes and a current condition code input to the control unit. Where control code has the target value, the oscillation unit outputs the oscillation signal with the oscillation frequency substantially equal to a target oscillation frequency.

According to another embodiment of the invention, a method of adjusting an oscillation frequency of an oscillation signal generated by an oscillator is provided. The oscillator comprises a data storage unit adapted to store a plurality of reference condition codes and a plurality of reference control codes, an oscillation unit adapted to output the oscillation signal with the oscillation frequency having a value that depends on a control code, and a control unit adapted to generate the control code with a target value based on a current condition code, the reference control codes, and the reference condition codes. The method comprises generating each reference control code as a respective value of the control code for which the oscillation frequency of the oscillation signal is substantially equal to a target oscillation frequency when a corresponding one of the reference condition codes is input to the control unit as the current condition code in response to one or more environmental conditions of the oscillator. The method further comprises storing the reference control codes and the reference condition codes in the data storage unit. The control unit generates the control code with a target value based on the current condition code, the reference control codes, and the reference condition codes. The oscillation unit outputs the oscillation signal with the oscillation frequency having a target value substantially equal to the target oscillation frequency in response to the control code.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 2:
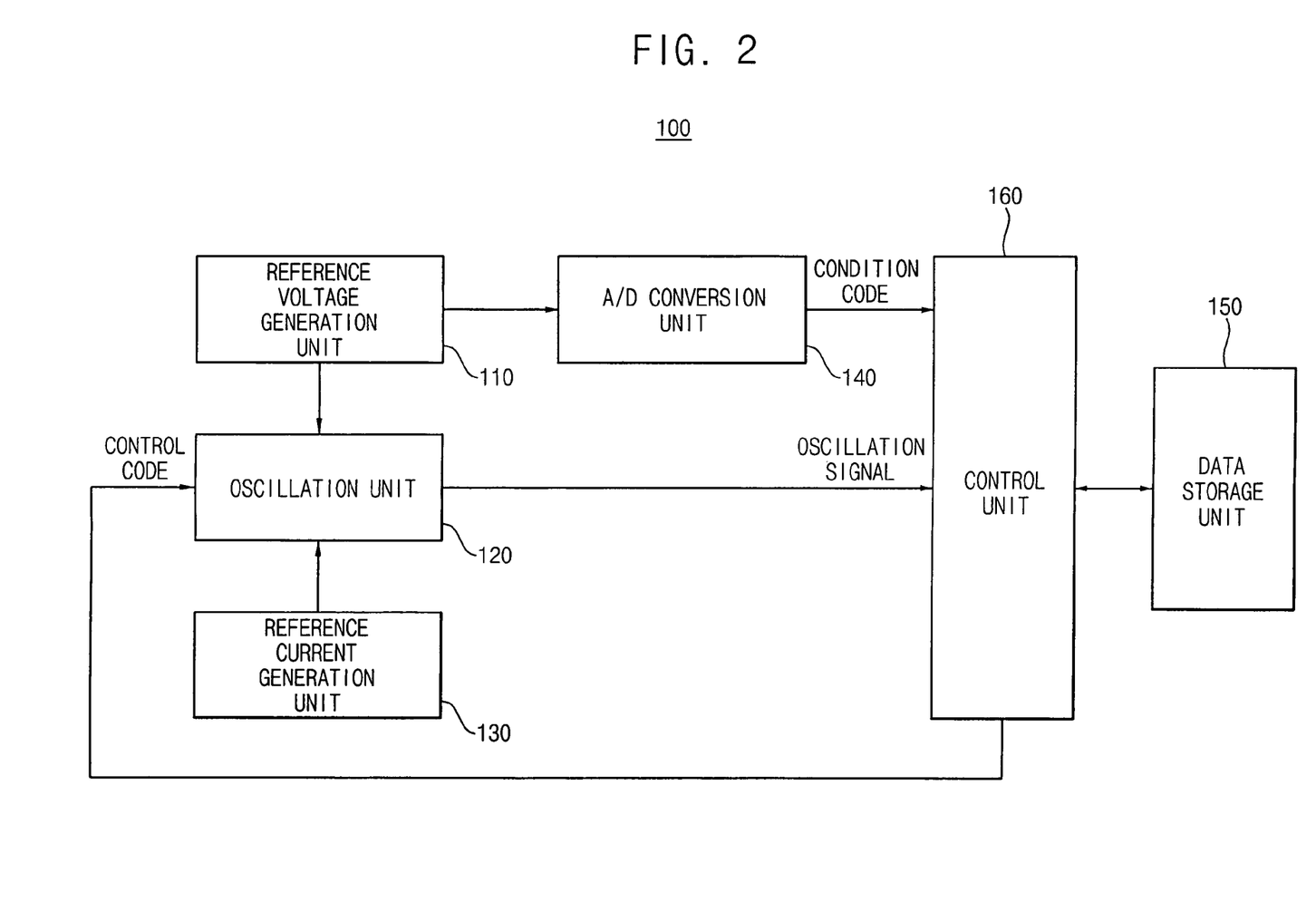
FIG. 2 is a block diagram illustrating an oscillator according to one embodiment of the invention.

FIG. 2 is a block diagram of an oscillator 100 according to an exemplary embodiment of the invention.

Referring to FIG. 2, oscillator 100 includes a reference voltage generation unit 110, an analog-to-digital (A/D) conversion unit 140, a reference current generation unit 130, an oscillation unit 120, and a control unit 160.

Reference voltage generation unit 110 generates a reference voltage with a level that varies continuously based on a temperature of oscillator 100 and provides the reference voltage to oscillation unit 120 and A/D conversion unit 140.

Figure 3:
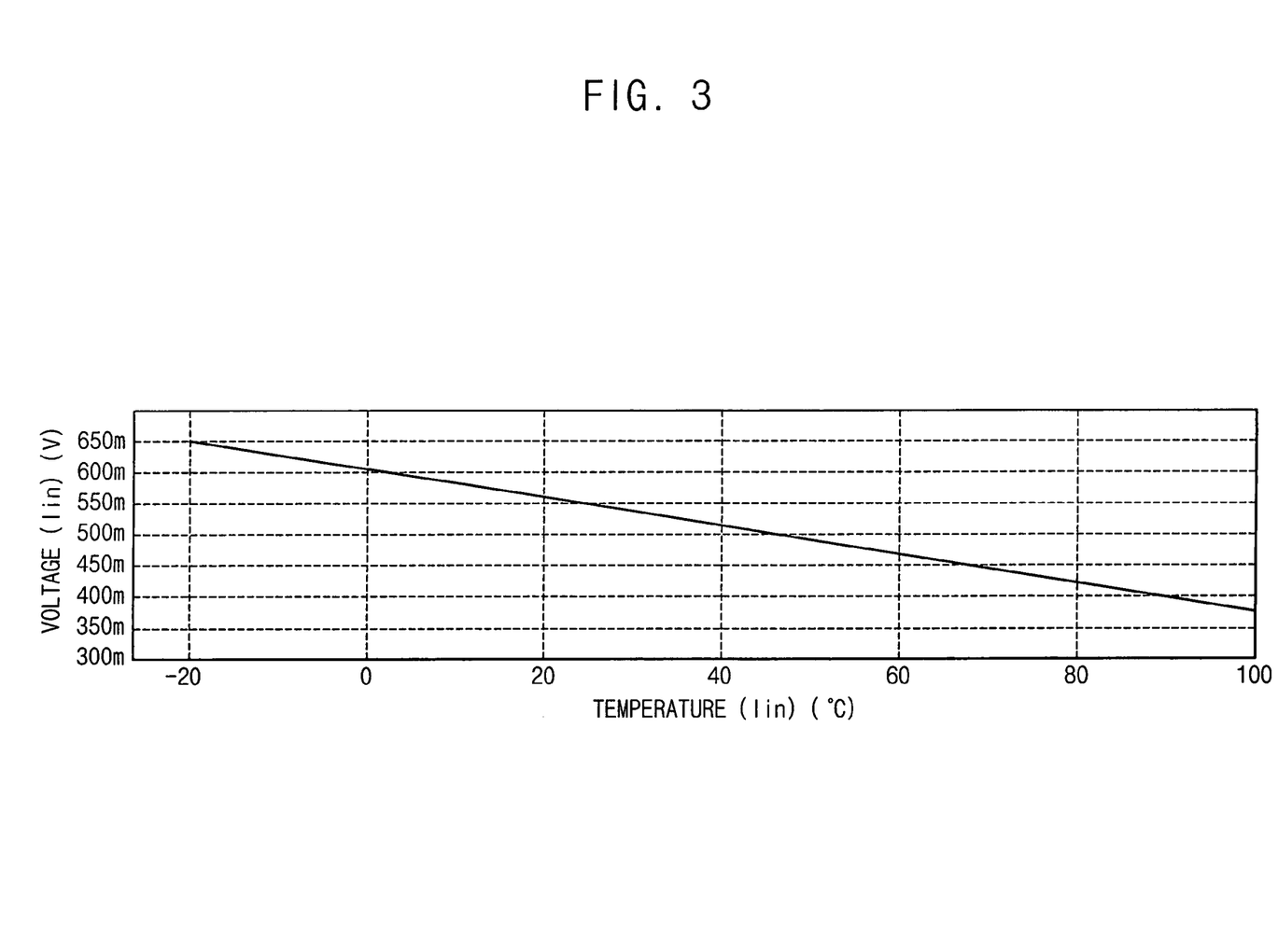
FIG. 3 is a graph illustrating output characteristics of a reference voltage generation unit in the oscillator of FIG. 2.

FIG. 3 is a graph illustrating output characteristics of reference voltage generation unit 110 of oscillator 100 in FIG. 2.

As illustrated in FIG. 3, the level of the reference voltage output by reference voltage generation unit 110 decreases continuously as the temperature of oscillator 100 increases. Reference voltage generation unit 110 is a simple, low-cost product that is used in a variety of conventional apparatuses.

In addition to providing the reference voltage, which is used to generate an oscillation signal, reference voltage generation unit 110 may be also used as a temperature sensor. For example, using the graph shown in FIG. 3, the temperature of oscillator 100 can be uniquely determined based on the level of the reference voltage.

A/D conversion unit 140 converts the reference voltage output by reference voltage generation unit 110 into digital data. The digital data derived from the reference voltage will be referred to as a "condition code" because it can be used to determine the levels of various environmental conditions such as temperature and a power voltage.

Reference current generation unit 130 generates a reference current and provides the reference current to oscillation unit 120. Oscillation unit 120 generates an oscillation signal based on the reference current. Preferably, reference current generation unit 130 generates the reference current with a level that is not affected by external environmental factors such as temperature, power voltage, and so on.

Figure 4:
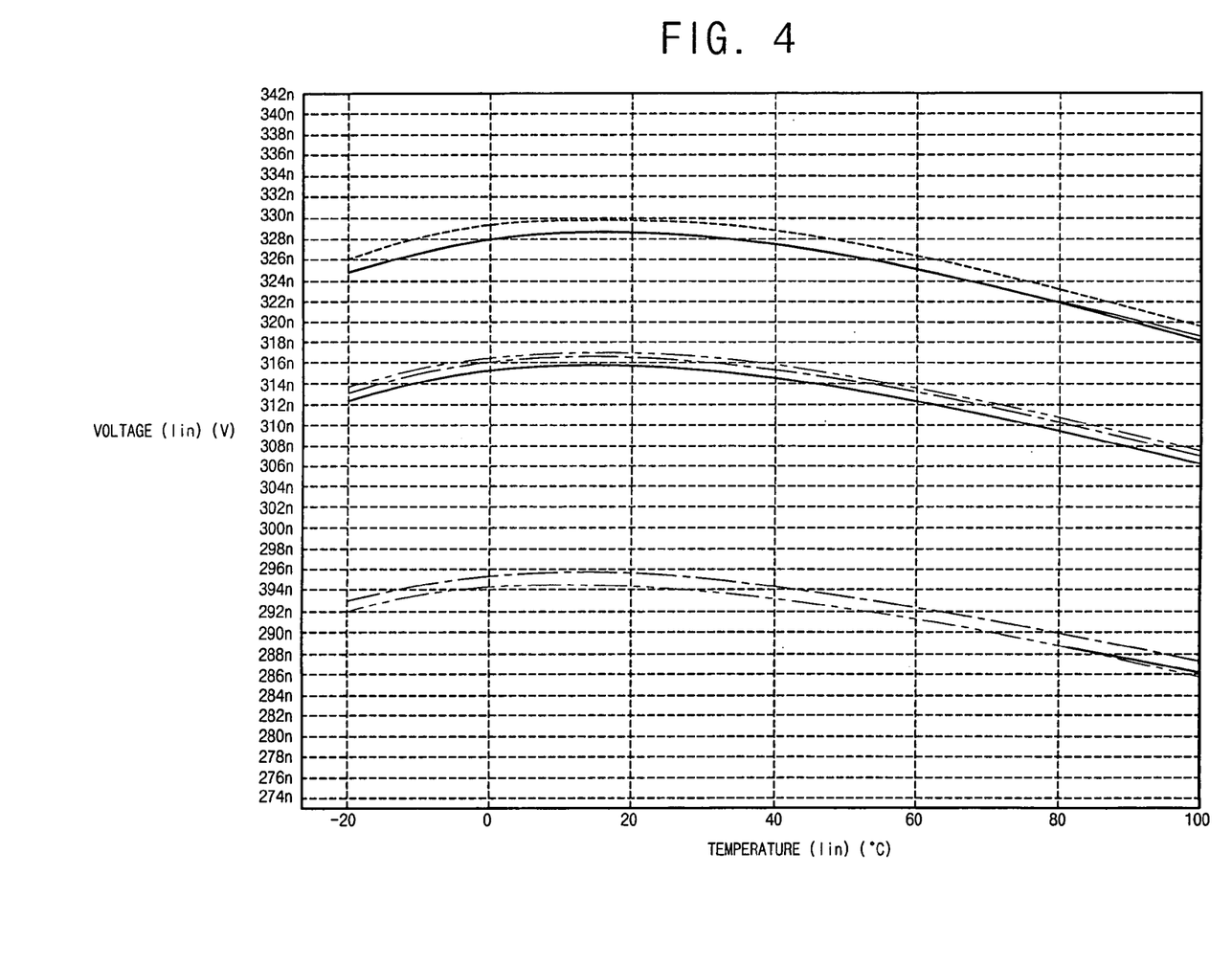
FIG. 4 is a graph illustrating output characteristics of a reference current generation unit in the oscillator of FIG. 2.

FIG. 4 is a graph illustrating output characteristics of reference current generation unit 130. As illustrated in FIG. 4, reference current generation unit outputs the reference current with a substantially constant level even in the presence of drastic temperature changes in oscillator 100.

Oscillation unit 120 outputs an oscillation signal in response to the reference voltage output by reference voltage generation unit 110, the reference current output by reference current generation unit 130, and a control code output by control unit 160. The control code output by control unit 160 is a digital signal derived from the condition code output by A/D conversion unit 140. The control code is used to control the operation of oscillation unit 120.

Figure 5:
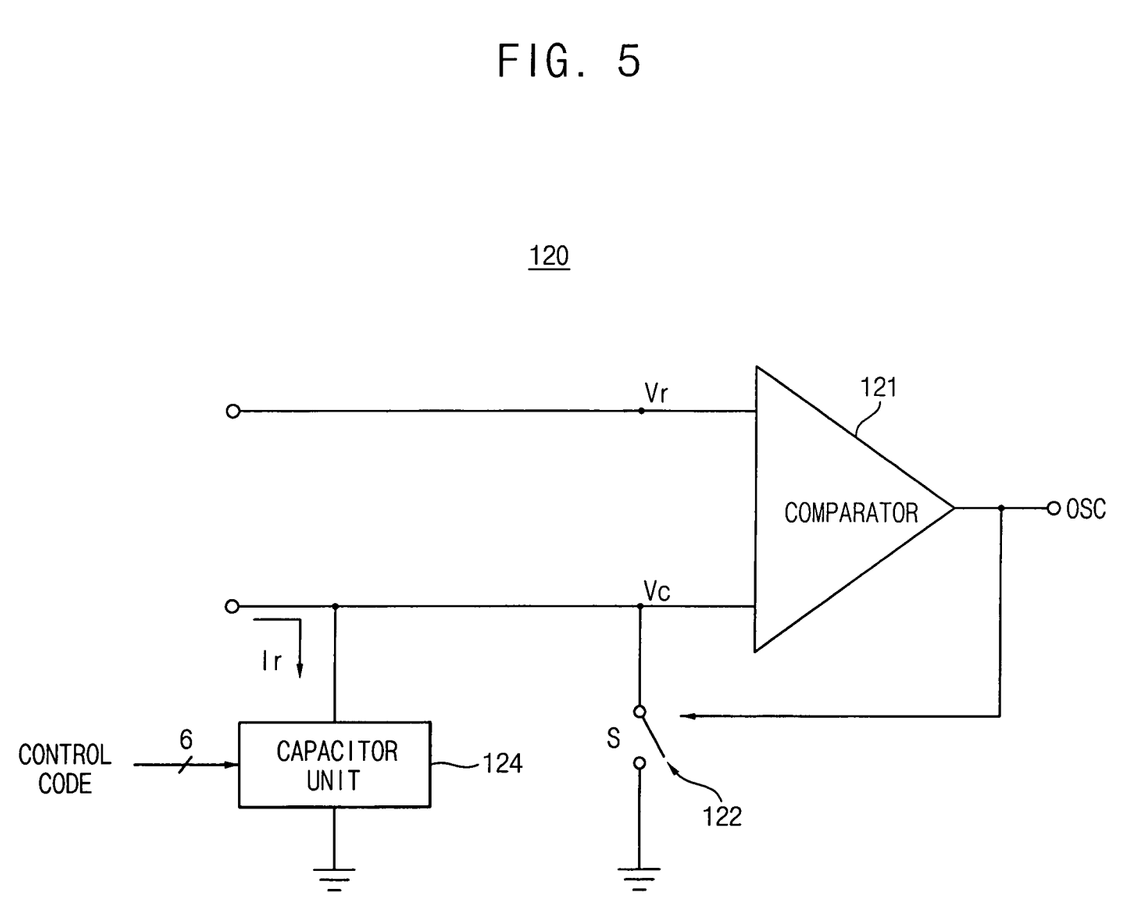
FIG. 5 is a circuit diagram of an oscillation unit shown in FIG. 2 according to one embodiment of the invention.

FIG. 5 is a circuit diagram of oscillation unit 120 according to one embodiment of the invention.

Referring to FIG. 5, oscillation unit 120 comprises a comparator 121, a discharge switch 122 and a capacitor unit 124.

Comparator 121 has a reference input terminal coupled to an output terminal of reference voltage generator 110 and a comparison input terminal coupled to an output terminal of reference current generator 130. Capacitor unit 124 and discharge switch 122 are coupled in parallel to the comparison input terminal of comparator 121. Discharge switch 122 is turned on and off in response to an oscillation signal OSC output by comparator 121.

Comparator 121 outputs oscillation signal OSC with a logic state based on a voltage difference between a reference voltage Vr apparent at the reference terminal and a comparison voltage Vc apparent at the comparison input terminal. When comparison voltage Vc of comparator 121 is higher than reference voltage Vr, discharge switch 122 is turned on by oscillation signal OSC and comparison voltage Vc decreases to a ground voltage by discharging through discharge switch 122. In contrast, when reference voltage Vr rises above comparison voltage Vc, discharge switch 122 is turned off.

As the temperature of oscillator 100 increases, reference voltage Vr decreases, comparison voltage Vc increases above reference voltage Vr, and as a result, an oscillation frequency FOSC of oscillation signal OSC increases. Conversely, as the temperature of oscillator 100 decreases, oscillation frequency FOSC of oscillation signal OSC decreases.

Capacitor unit 124 is charged by the reference current Ir output by reference current generation unit 130. A capacitance of capacitor unit 124 may be varied in response to the control code output by control unit 160.

Figure 6:
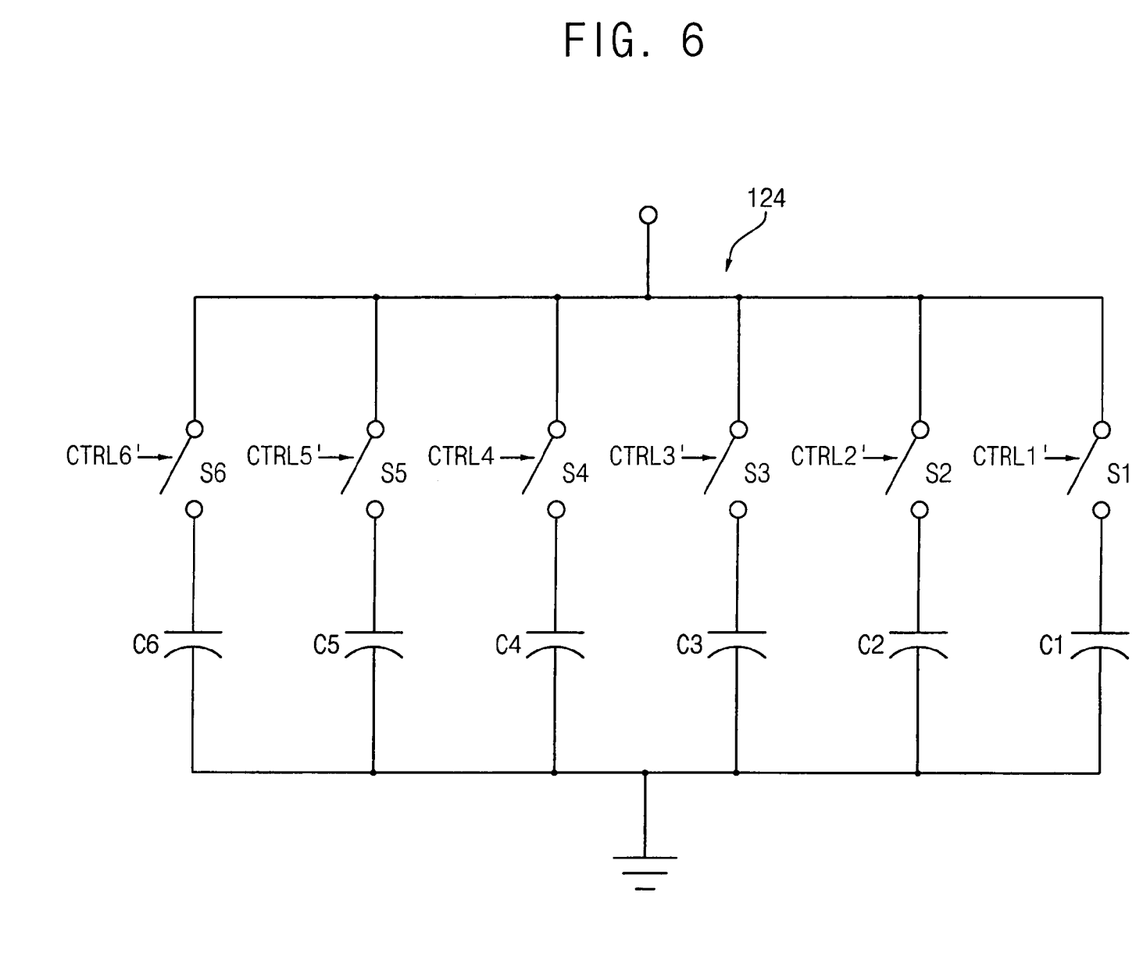
FIG. 6 is a circuit diagram of a capacitor unit shown in FIG. 5 according to one embodiment of the invention.

FIG. 6 is a circuit diagram of capacitor unit 124 in FIG. 5 according to one embodiment of the invention.

Referring to FIG. 6, capacitor unit 124 includes first through sixth capacitors C1 through C6 and first through sixth switches S1 through S6. Capacitors C1 through C6 are connected in parallel between the comparison input terminal of comparator 121 and ground via respective switches S1 through S6. Switches S1 through S6 are controlled to open and close in response to the control code output by control unit 160.

The respective capacitances of capacitors C1 through C6 preferably increase monotonically so that first capacitor C1 has the smallest capacitance and sixth capacitor C6 has the greatest capacitance.

Switches S1 through S6 are respectively connected to capacitors C1 through C6 in series. Each of switches S1 through S6 is turned on in response to the inverse of a corresponding bit of the control code output by control unit 160. For example, first switch S1 turns on in response to the inverse CTRL1' of a control signal CTRL1, which is a least significant bit (LSB) of the control code, and sixth switch S6 turns on in response to the inverse CTRL6 of a control signal CTRL6, which is a most significant bit (MSB) of the control code output by control unit 160. Accordingly, the capacitance of capacitor unit 124 can be varied based on the control code output by control unit 160.

As described above, oscillation frequency FOSC of oscillation signal OSC increases as the temperature of oscillator 100 increases, and decreases as the temperature of oscillator 100 decreases. The inverses of control signals CTRL1 through CTRL6 of the control code output by control unit 160 are respectively input to switches S1 through S6 of capacitor unit 124 to adjust the capacitance of capacitor unit 124. When the temperature of oscillator 100 increases, control unit 160 decreases a value of the control code to increase the capacitance of capacitor unit 124 in order to decrease oscillation frequency FOSC of oscillation signal OSC. In contrast, when the temperature of oscillator 100 decreases, control unit 160 increases the value of the control code to increase oscillation frequency FOSC of oscillation signal OSC.

Switches S1 through S6 can also be controlled by oscillation signal OSC without inverting control signals CTRL1 through CTRL6. In this case, when the temperature of oscillator 100 increases, control unit 160 increases the value of the control code, and when the temperature of oscillator 100 decreases, control unit 160 decreases the value of the control code. Consequently, oscillation frequency FOSC of oscillation signal OSC may be controlled by adjusting the capacitance of capacitor unit 124, and the capacitance of capacitor unit 124 may be adjusted based on the control code output by control unit 160.

Data storage unit 150 stores various kinds of data under control of a control of control unit 160. For example, data storage unit 150 may store the condition codes output by A/D conversion unit 140 and the control codes output by control unit 160. Data storage unit 150 typically includes memory devices such as a data register, read-only memory (ROM), and so on.

Control unit 160 inputs a plurality of control codes to oscillation unit 120 based on external environmental factors such as temperature, power voltage, and so on, and stores a plurality of condition codes and control codes into data storage unit 150. Control unit 160 also determines a proper control code corresponding to a current condition code, on a basis of the condition codes and the control codes stored in data storage unit 150 to input the proper control code to oscillation unit 120. The operation of control unit 160 is described in further detail below with reference to a method of compensating for an oscillation signal.

Reference voltage generation unit 110, oscillation unit 120, reference current generation unit 130 and A/D conversion unit 140 are preferably implemented in a single chip, and data storage unit 150 and control unit 160 are preferably implemented as software on a storage device and a processor. Implementing the components in this way tends to minimize the power consumption by oscillator 100. In other embodiments, elements 110 through 160 can all be included in a single chip.

Figure 7:
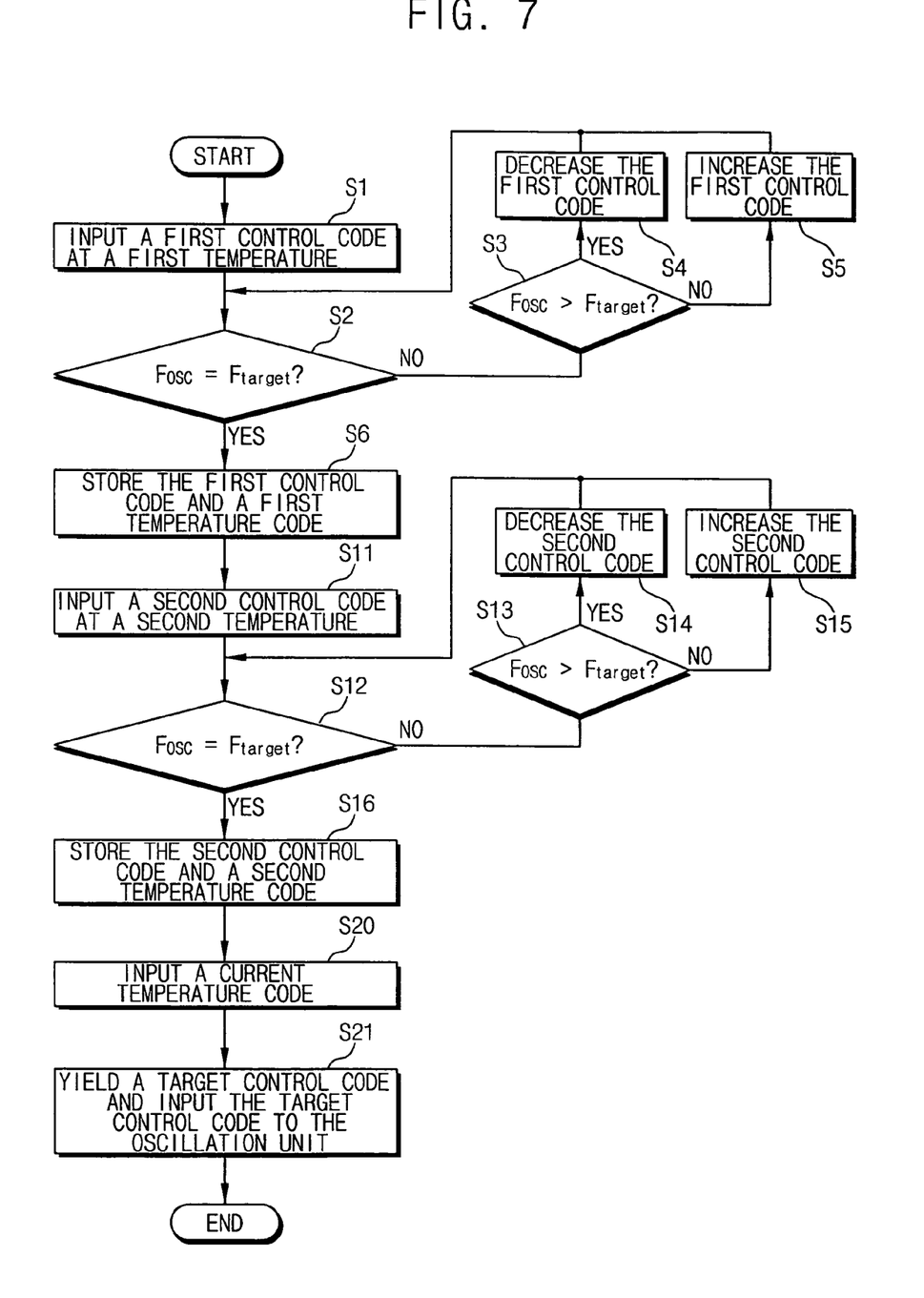
FIG. 7 is a flow chart illustrating a method of adjusting the oscillation frequency of an oscillation signal output by the oscillator shown in FIG. 2 according to one embodiment of the invention.

FIG. 7 is a flow chart illustrating a method of adjusting the oscillation frequency an oscillation signal output by oscillator 100 according to one embodiment of the present invention. In general, the method illustrated in FIG. 7 is performed to compensate for changes in external environmental conditions such as the temperature and power supply voltage of oscillator 100. The method illustrated in FIG. 7 is explained in the context of oscillator 100 shown in FIG. 2, with control unit 160 controlling most of the operations. However, the method can be performed by other devices.

In the description that follows, exemplary method steps are denoted by parentheses (XXX) to distinguish them from exemplary elements or system components such as those illustrated in FIG. 2.

Referring to FIG. 7, control unit 160 inputs a first control code to capacitor unit 124 of oscillation unit 120 when oscillator 100 has a first temperature (S1). The first temperature of oscillator 100 is a temperature near a lowest temperature within the operating temperature range of oscillator 100.

When oscillation signal OSC is output by oscillation unit 120 in response to the first control code, control unit 160 determines whether an oscillation frequency FOSC of oscillation signal OSC is equivalent to a target oscillation frequency Ftarget (S2).

Where oscillation frequency FOSC is not equivalent to target oscillation frequency Ftarget, control unit 160 determines whether or not oscillation frequency FOSC is higher than target oscillation frequency Ftarget (S3). Where oscillation frequency FOSC is higher than target oscillation frequency Ftarget, control unit 160 decreases the control code by a predetermined number of bits (e.g., one bit) and inputs the decreased control code to oscillation unit 120 (S4). On the other hand, where oscillation frequency FOSC is lower than target oscillation frequency Ftarget, control unit 160 increases the control code by a predetermined number of bits (e.g., one bit) and inputs the increased control code to oscillation unit 120 (S5).

Where oscillation frequency FOSC is equivalent to target oscillation signal Ftarget, control unit 160 stores the first control code and a first temperature code output by A/D conversion unit 140 corresponding to the first temperature into data storage unit 150 (S6). The first temperature code is one type of condition code that can be produced by oscillator 100 and stored in data storage unit 150.

Control unit 160 inputs a second control code to capacitor unit 124 of oscillation unit 120 when oscillator 100 has a second temperature (S11). The second temperature of oscillator 100 is a temperature near a highest temperature within the operating temperature range of oscillator 100.

When oscillation signal OSC is output by oscillation unit 120 in response to the second control code, control unit 160 determines whether the oscillation frequency FOSC of oscillation signal OSC is equivalent to target oscillation frequency Ftarget (S12).

Where oscillation frequency FOSC is not equivalent to target oscillation frequency Ftarget, control unit 160 determines whether or not oscillation frequency FOSC is higher than target oscillation frequency Ftarget (S13). Where oscillation frequency FOSC is higher than target oscillation frequency Ftarget, control unit 160 decreases the control code by a predetermined number of bits (for example, one bit) and inputs the decreased control code to oscillation unit 120 (S14). On the other hand, where oscillation frequency FOSC is lower than target oscillation frequency Ftarget, control unit 160 increases the control code by a predetermined number of bits (for example, one bit) to input the increased control code to oscillation unit 120(S15).

Where oscillation frequency FOSC is equivalent to target oscillation frequency Ftarget, control unit 160 stores the second temperature code and a second temperature code output by A/D conversion unit 140 corresponding to the second control code into data storage unit 150 (S16).

Through the above method including steps S1 through S16, data storage unit 150 stores the first temperature code indicating the first temperature and the first control code for generating the oscillation signal having target oscillation frequency Ftarget at the first temperature. In addition, data storage unit 150 stores the second temperature code indicating the second temperature and the second control code for generating the oscillation signal having target oscillation frequency Ftarget at the second temperature.

Control unit 160 may determine a control code for generating an oscillation signal having target oscillation frequency Ftarget at any temperature between the first and second temperatures by using the first control code and the second control code for compensating the oscillation signal according to the first and second temperatures.

Figure 8:
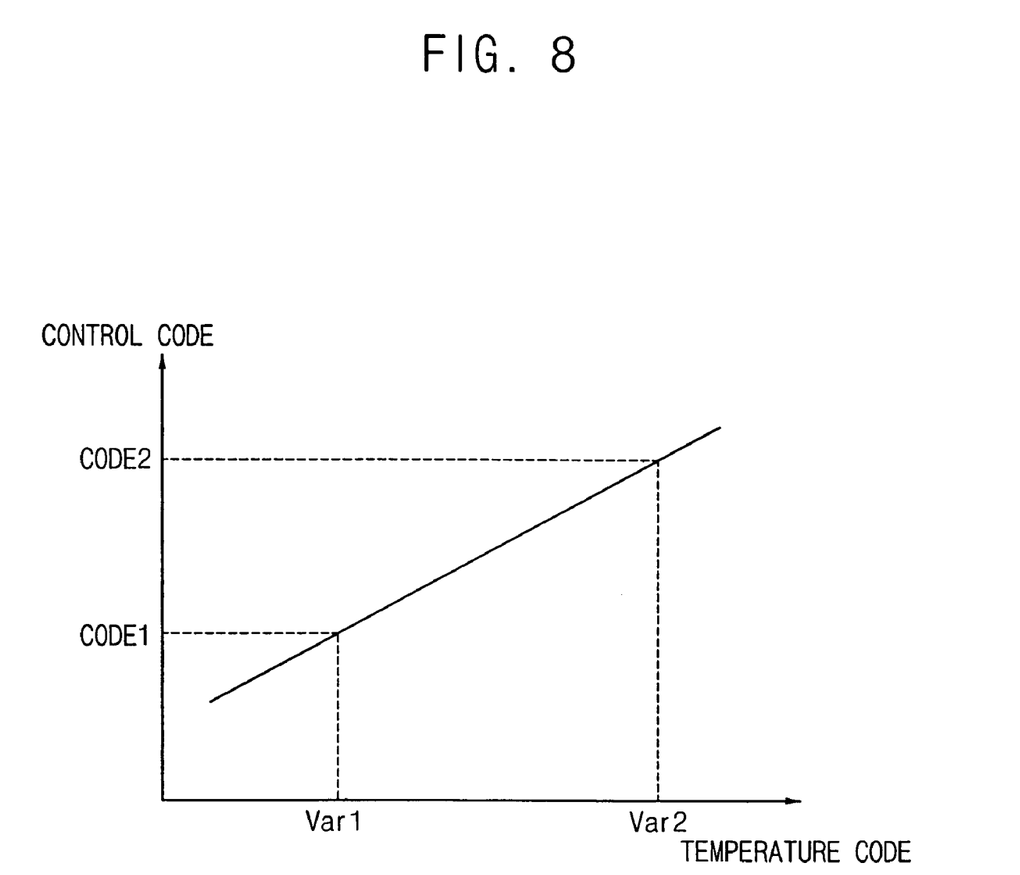
FIG. 8 is a graph illustrating an exemplary relationship between a temperature code and a control code; and, FIG. 9 is a flow chart illustrating a method of adjusting the oscillation frequency of an oscillation signal output by the oscillator shown in FIG. 2 according to another embodiment of the invention.

FIG. 8 is a graph illustrating an exemplary relationship between a temperature code and a control code in oscillator 100.

As illustrated by FIG. 8, the control code varies linearly with the temperature code. Accordingly, the control code for generating oscillation signal OSC with target oscillation frequency Ftarget at any temperature may be calculated by the following Equation 1.

$$FtargetCode=(Code2-Code1)/(Var2-Var1)\times Var+ (Var1\times Code2-Var2\times Code1)/(Var1-Var2). \quad \text{(Equation 1)}$$

In Equation 1, FtargetCode is a target control code used to generate target oscillation signal Ftarget, Code1 is a first control code, Code2 is a second control code, Var is a current temperature code, Var1 is a first temperature code, and Var2 is a second temperature code.

Where A/D conversion unit 140 outputs a temperature code corresponding to a current temperature (S20), control unit 160 generates a target control code by using the first temperature code, the second temperature code, the first control code and the second control code stored in data storage unit 150. Control unit 160 inputs the target control code to oscillation unit 120 and oscillation unit 120 outputs a compensated oscillation signal corresponding to the target control code (S21).

The first and second control codes can be referred to as "reference control codes" and the first and second temperature codes can be referred to as "reference condition codes" because all of these codes are used as references for determining the value of FtargetCode.

A method of adjusting the frequency of oscillation signal OSC to compensate for changes in the temperature of oscillator 100 is described with reference to FIG. 7. However, other variations such as variations of a power voltage can also influence the frequency of oscillation signal OSC.

The condition code output by A/D conversion unit 140 may include general information related to external environmental factors, such as temperature, power voltage, and so on, because reference voltage generation unit 110 not only has specific temperature variation information, but also has general information related to variations in external environmental factors, such as a temperature, a power voltage, and so on.

Figure 9:
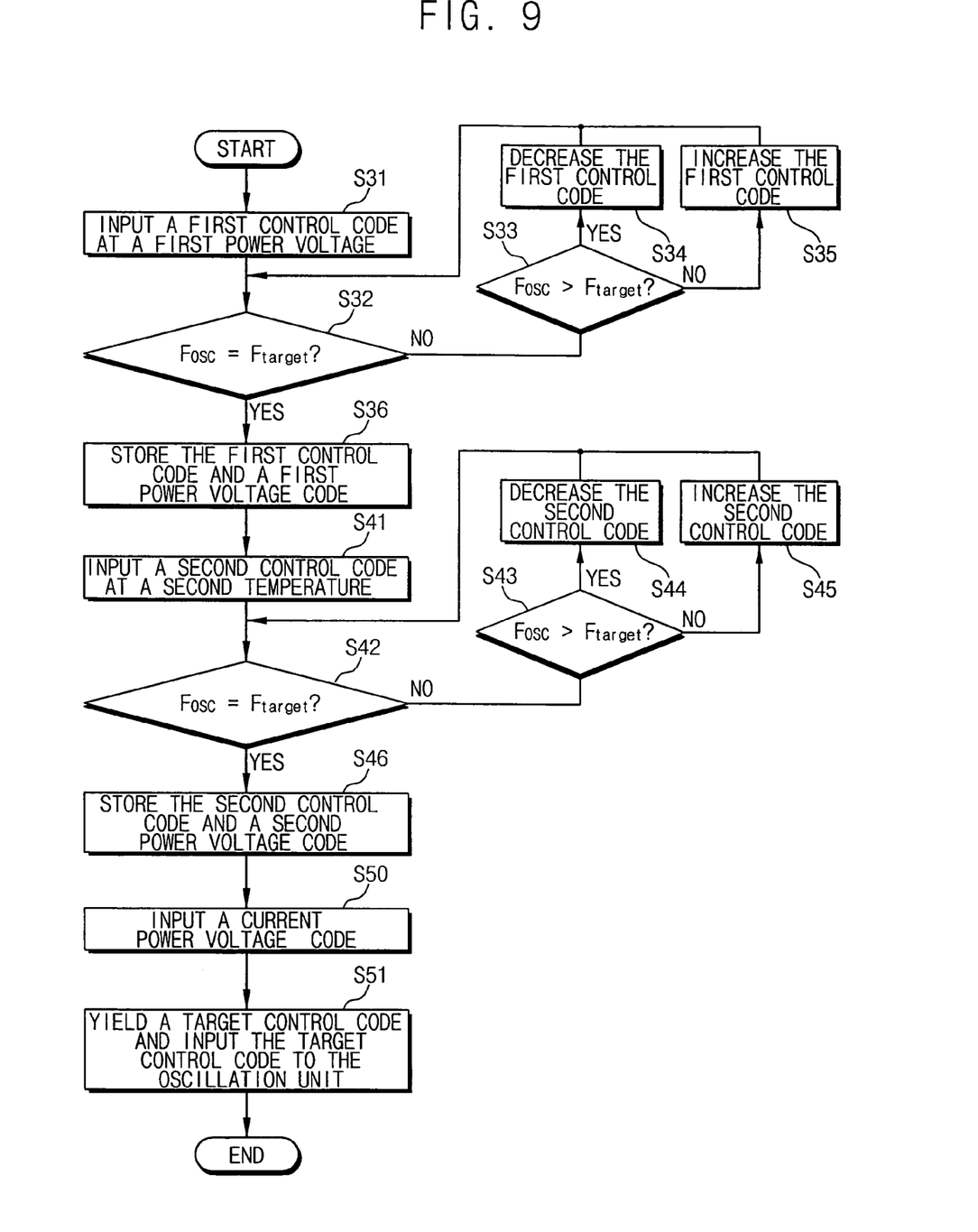

By using the above procedure illustrated in FIG. 7, adjustment or compensation can be performed according to power voltage. FIG. 9 illustrates compensation according to a power voltage.

FIG. 9 is a flow chart illustrating a method of adjusting the oscillation frequency FOSC of oscillation signal OSC in oscillator 100 based on variations in the power voltage of oscillator 100 according to a another example embodiment of the present invention. Although the method of FIG. 9 is illustrated in the context of oscillator 100, those skilled in the art will understand that other hardware and or software arrangements and other devices can be used to implement the method.

Referring to FIG. 9, control unit 160 inputs a first control code to capacitor unit 124 of oscillation unit 120 at a first power voltage (S31). The first power voltage is a power voltage near a lowest power voltage within the operating power voltage range of oscillator 100.

When the oscillation signal is output by oscillation unit 120 in response to the first control code, control unit 160 determines whether or not oscillation frequency FOSC is equivalent to a target oscillation frequency Ftarget (S32).

Where oscillation frequency FOSC is not equivalent to a target oscillation frequency Ftarget, control unit 160 determines whether or not oscillation frequency FOSC is higher than target oscillation frequency Ftarget (S33). Where oscillation frequency FOSC is higher than target oscillation frequency Ftarget, control unit 160 decreases the control code by a predetermined number of bits (e.g., one bit) to input the decreased control code to oscillation unit 120 (S34), and where oscillation frequency FOSC is lower than target oscillation frequency Ftarget, control unit 160 increases the control code by a predetermined number of bits (e.g., one bit) to input the increased control code to oscillation unit 120 (S35).

Where oscillation frequency FOSC is equivalent to target oscillation frequency Ftarget, control unit 160 stores the first control code and a first power voltage code output by A/D conversion unit 140 corresponding to the first power voltage into data storage unit 150 (S36). The first power voltage code is a condition code, and the condition code is named as the power voltage code since FIG. 9 illustrates the method of compensating for an oscillation signal with respect to the power voltage variation.

Control unit 160 inputs a second control code to capacitor unit 124 of oscillation unit 120 at a second power voltage (S41). The second power voltage of oscillator 100 is a power voltage near the highest power voltage within the operating power voltage range of oscillator 100.

Where the oscillation signal is output by oscillation unit 120 in response to the second control code, control unit 160 determines whether or not oscillation frequency FOSC is equivalent to target oscillation frequency Ftarget (S42).

Where oscillation frequency FOSC is not equivalent to target oscillation frequency Ftarget, control unit 160 determines whether or not oscillation frequency FOSC is higher than target oscillation frequency Ftarget (S43). Where oscillation frequency FOSC is higher than target oscillation frequency Ftarget, control unit 160 decreases the control code by a predetermined number of bits (e.g., one bit) to input the decreased control code to oscillation unit 120 (S44). On the other hand, where oscillation frequency FOSC is lower than target oscillation frequency Ftarget, control unit 160 increases the control code by a predetermined number of bits (e.g., one bit) to input the increased control code to oscillation unit 120 (S45).

Where oscillation frequency FOSC is equivalent to a target oscillation frequency Ftarget, control unit 160 stores the control code and a second power voltage code output by A/D conversion unit 140 corresponding to the second control code into data storage unit 150 (S46).

Through the above procedure including steps S31 through S46, data storage unit 150 stores the first power voltage code indicating the first power voltage and the first control code for generating the target oscillation signal Ftarget at the first power voltage. In addition, data storage unit 150 stores the second power voltage code indicating the second power voltage and the second control code for generating target oscillation signal Ftarget at the second power voltage.

Control unit 160 may determine a control code for generating an oscillation signal having target oscillation frequency Ftarget at any power voltage between the first and second power voltages by using the first control code and the second control code to adjust the oscillation signal according to the first and second power voltages. The control code for generating target oscillation signal Ftarget at any power voltage may be calculated by the following Equation 2.

$$FtargetCode = (Code2 - Code1)/(Var2 - Var1) \times Var + (Var1 \times Code2 - Var2 \times Code1)/(Var1 - Var2). \quad \text{(Equation 2)}$$

In Equation 2, FtargetCode is a target control code for generating target oscillation signal Ftarget, Code1 is a first control code, Code2 is a second control code, Var is a current power voltage code, Var1 is a first power voltage code, and Var2 is a second power voltage code.

Where A/D conversion unit 140 outputs a power voltage code for a current power voltage (S50), control unit 160 generates target control code FtargetCode using the first power voltage code, the second power voltage code, the first control code and the second control code stored in data storage unit 150. Control unit 160 inputs the target control code to oscillation unit 120 and oscillation unit 120 outputs a compensated oscillation signal corresponding to the target control code (S51).

The first and second control codes can be referred to as "reference control codes" and the first and second power voltage codes can be referred to as "reference condition codes" because all of these codes are used as references for determining the value of FtargetCode.

As described above, the oscillator and the method of adjusting the oscillation frequency of the oscillation signal according to the above example embodiments of the present invention may transform a target capacitance into data such as a temperature code, a power voltage code and so on. The target capacitance is determined according to external environmental factors, such as temperature, power voltage and so on. The data corresponding to the target capacitance is stored and the oscillation signal may be adjusted, or compensated for based on the stored data.

Accordingly, the oscillation signal may be compensated for according to external environmental factors such as a temperature, a power voltage, etc. while using a low-cost oscillator.

The foregoing preferred embodiments are teaching examples. Those of ordinary skill in the art will understand that various changes in form and details may be made to the exemplary embodiments without departing from the scope of the present invention as defined by the following claims.

What is claimed:

1. An oscillator, comprising:
   a data storage unit adapted to store a plurality of reference condition codes and a plurality of reference control codes;
   an oscillation unit adapted to output an oscillation signal having an oscillation frequency that varies according to a control code; and,
   a control unit computing the control code with a target value using a mathematical equation using the reference condition codes, the reference control codes, and a current condition code input to the control unit, wherein the current condition code corresponds to at least one current environmental condition of the oscillator, and wherein, when the control code has the target value, the oscillation unit outputs the oscillation signal with the oscillation frequency substantially equal to a target oscillation frequency, and
   wherein each of the reference control codes comprises a respective value of the control code for which the oscillation frequency of the oscillation signal is substantially equal to the target oscillation frequency when a corresponding one of the reference condition codes is input to the control unit as the current condition code in response to one of the at least one current environmental condition of the oscillator.

2. An oscillator, comprising:
   a data storage unit adapted to store a plurality of reference condition codes and a plurality of reference control codes;
   an oscillation unit adapted to output an oscillation signal having an oscillation frequency that varies according to a control code;
   a control unit computing the control code with a target value using a mathematical equation using the reference condition codes, the reference control codes, and a current condition code input to the control unit, wherein the current condition code corresponds to at least one current environmental condition of the oscillator, and wherein, when the control code has the target value, the oscillation unit outputs the oscillation signal with the oscillation frequency substantially equal to a target oscillation frequency;
   a reference voltage generation unit adapted to generate a reference voltage signal with a level that varies continuously according to external environmental factors and provide the reference voltage signal to the oscillation unit;
   an analog-to-digital (A/D) conversion unit adapted to convert the reference voltage signal into digital data corresponding to the current condition code; and,
   a reference current generation unit adapted to generate a reference current and provide the reference current to the oscillation unit.

3. The oscillator of claim 2, wherein the oscillation unit comprises:
   a comparator having a reference input terminal coupled to an output terminal of the reference voltage generation unit and a comparison input terminal coupled to an output of the reference current generation unit, wherein the comparator is adapted to output the oscillation signal based on a voltage difference between the reference input terminal and the comparison input terminal;
   a capacitor unit connected between the comparison input terminal and a first electrical potential, wherein the capacitor unit is charged by the reference current, and a capacitance of the capacitor unit is controlled by the control code; and,
   a discharge switch connected between the comparison input terminal and a second electrical potential and controlled by the oscillation signal.

4. The oscillator of claim 3, wherein the capacitor unit comprises:
- a plurality of capacitors coupled in parallel between the comparison input terminal and the first electrical potential; and,
- a plurality of switches coupled in series with the respective capacitors and controlled by corresponding bits of the control code.

5. The oscillator of claim 4, wherein the capacitance of each one of the capacitors is proportional to a level of the bit in the control code that controls the capacitor.

6. The oscillator of claim 3, wherein the discharge switch is turned on to discharge the comparison input terminal to ground when the level of a comparison voltage apparent at the comparison input terminal is greater than the level of the reference voltage signal, and turned off when the level of the reference voltage signal is higher than the comparison voltage.

7. The oscillator of claim 2, wherein the level of the reference voltage signal decreases as the temperature of the oscillator increases.

8. The oscillator of claim 2, wherein the level of the reference current is not affected by the temperature or a power voltage of the oscillator.

9. The oscillator of claim 2, wherein the A/D conversion unit, the reference current generation unit and the oscillation unit are included in a single chip, and the data storage unit and the control unit are included in an external device.

10. The oscillator of claim 2, wherein the external environmental factors comprise at least one of a temperature and a power voltage of the oscillator.

11. A method of adjusting an oscillation frequency of an oscillation signal generated by an oscillator comprising a data storage unit adapted to store a plurality of reference condition codes and a plurality of reference control codes, an oscillation unit adapted to output the oscillation signal with the oscillation frequency having a value that depends on a control code, and a control unit, the method comprising:
- generating each reference control code as a respective value of the control code for which the oscillation frequency of the oscillation signal is substantially equal to a target oscillation frequency when a corresponding one of the reference condition codes is input to the control unit as a current condition code;
- storing the reference control codes and the reference condition codes in the data storage unit;
- computing the control code with a target value using the control unit, wherein the control unit receives the current condition code and computes the control code with the target value using a mathematical equation using the reference condition codes, the reference control codes, and the current condition code, and wherein the current condition code corresponds to at least one current environmental condition of the oscillator; and,
- by operation of the oscillation unit outputting the oscillation signal with the oscillation frequency having a target value substantially equal to the target oscillation frequency in response to the control code,
- wherein generating each reference control code comprises:
  - determining whether the oscillation frequency is substantially the same as the target frequency;
  - varying the control code and inputting the varied control code to the oscillator unit when the oscillation frequency is not substantially the same as the target frequency; and,
  - determining the reference control code to be a value of the varied control code for which the oscillation frequency is substantially the same as the target frequency.

12. The method of claim 11, wherein varying the control code comprises:
- decreasing the control code and inputting the decreased control code to the oscillator unit when the oscillation frequency is higher than the target frequency; and,
- increasing the control code and inputting the increased control code to the oscillator unit when the oscillation frequency is lower than the target frequency.

13. A method of adjusting an oscillation frequency of an oscillation signal generated by an oscillator comprising a data storage unit adapted to store a plurality of reference condition codes and a plurality of reference control codes, an oscillation unit adapted to output the oscillation signal with the oscillation frequency having a value that depends on a control code, and a control unit, the method comprising:
- generating each reference control code as a respective value of the control code for which the oscillation frequency of the oscillation signal is substantially equal to a target oscillation frequency when a corresponding one of the reference condition codes is input to the control unit as a current condition code;
- storing the reference control codes and the reference condition codes in the data storage unit;
- computing the control code with a target value using the control unit, wherein the control unit receives the current condition code and computes the control code with the target value using a mathematical equation using the reference condition codes, the reference control codes, and the current condition code, and wherein the current condition code corresponds to at least one current environmental condition of the oscillator; and,
- by operation of the oscillation unit, outputting the oscillation signal with the oscillation frequency having a target value substantially equal to the target oscillation frequency in response to the control code,
- wherein the plurality of reference control codes comprises two (2) reference control codes, and the plurality of reference condition codes comprises two (2) reference condition codes, and
- wherein computing the control code with the target value using a mathematical equation using the current condition code, the reference control codes, and the reference condition codes comprises computing a target control code FtargetCode according to the following equation:

$$FtargetCode = (Code2 - Code1)/(Var2 - Var1) \times Var + (Var1 \times Code2 - Var2 \times Code1)/(Var1 - Var2);$$

wherein Code1 represents a first control code among the reference control codes, Code2 represents a second control code among the reference control codes, Var represents the current condition code, Var1 represents a first condition code among the reference condition codes, and Var2 represents a second condition code among the reference condition codes.

* * * * *